(12) United States Patent  (10) Patent No.: US 8,395,929 B2
Siau  (45) Date of Patent: Mar. 12, 2013

(54) SIGNAL MARGIN IMPROVEMENT FOR READ OPERATIONS IN A CROSS-POINT MEMORY ARRAY

(75) Inventor: Chang Hua Siau, Saratoga, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 13/449,011

(22) Filed: Apr. 17, 2012

(65) Prior Publication Data

US 2012/0201086 A1 Aug. 9, 2012

Related U.S. Application Data

(63) Continuation of application No. 12/653,860, filed on Dec. 18, 2009, now Pat. No. 8,159,858.

(60) Provisional application No. 61/203,212, filed on Dec. 19, 2008.

(51) Int. Cl.
*G11C 11/00* (2006.01)

(52) U.S. Cl. ........................................... 365/148
(58) Field of Classification Search .................... 365/148
See application file for complete search history.

(56) References Cited

U.S. PATENT DOCUMENTS

| 6,259,644 | B1 | 7/2001 | Tran et al. | 365/209 |
| 6,839,269 | B2 | 1/2005 | Iwata et al. | 365/158 |
| 7,075,817 | B2 | 7/2006 | Rinerson | 365/158 |
| 7,099,179 | B2 | 8/2006 | Rinerson | 365/148 |
| 7,149,107 | B2 | 12/2006 | Rinerson | 365/158 |
| 7,372,753 | B1 | 5/2008 | Rinerson | 365/209 |
| 7,379,364 | B2 | 5/2008 | Siau et al. | 365/209 |
| 7,701,791 | B2 * | 4/2010 | Rinerson et al. | 365/203 |
| 8,159,858 | B2 * | 4/2012 | Siau | 365/148 |
| 2006/0023497 | A1 | 2/2006 | Kawazoe et al. | 365/158 |
| 2007/0103963 | A1 | 5/2007 | Kim et al. | 365/148 |
| 2008/0080295 | A1 | 4/2008 | Namekawa et al. | 365/230.06 |
| 2008/0212361 | A1 * | 9/2008 | Bertin et al. | 365/151 |
| 2008/0285360 | A1 * | 11/2008 | Sakimura et al. | 365/189.15 |
| 2009/0027977 | A1 | 1/2009 | Rinerson | 365/189.15 |
| 2010/0091550 | A1 * | 4/2010 | Chen et al. | 365/148 |

OTHER PUBLICATIONS

Siau, Chang, U.S. Appl. No. 12/653,860, filed Dec. 18, 2009, Notice to File Missing Parts dated Mar. 9, 2010. 2 pages.
Siau, Chang, U.S. Appl. No. 12/653,860, filed Dec. 18, 2009, Reply dated Mar. 12, 2010 to the Notice of Missing Parts of Mar. 9, 2010. 13 pages.
Siau, Chang, U.S. Appl. No. 12/653,860, filed Dec. 18, 2009, Notice of Incomplete Reply mailed Mar. 31, 2010. 2 pages.
Siau, Chang, U.S. Appl. No. 12/653,860, filed Dec. 18, 2009, Reply dated Mar. 31, 2010 to the Notice of Incomplete Reply of Mar. 31, 2010. 3 pages.
Siau, Chang, U.S. Appl. No. 12/653,860, filed Dec. 18, 2009, Notice of Incomplete Reply mailed Apr. 12, 2010. 2 pages.

(Continued)

*Primary Examiner* — Hoai V Ho
*Assistant Examiner* — Min Huang
(74) *Attorney, Agent, or Firm* — Stolowitz Ford Cowger LLP

(57) ABSTRACT

A configuration for biasing conductive array lines in a two-terminal cross-point memory array is disclosed. The configuration includes applying a read voltage to a selected X-conductive array line while applying an un-select voltage thru a biasing element to a remaining plurality of un-selected X-conductive array lines. A plurality of Y-conductive array lines are initially biased to some voltage (e.g., 0V) and then allowed to float unbiased after a predetermined amount of time has passed, some event has occurred, or both. As one example the event that triggers the floating of the plurality of Y-conductive array lines can be the read voltage reaching a predetermined magnitude. The array can be formed BEOL and include a plurality of two-terminal memory cells with each memory cell including a memory element and optionally a non-ohmic device (NOD) that are electrically in series with each other and with the two terminals of the memory cell.

20 Claims, 14 Drawing Sheets

OTHER PUBLICATIONS

Siau, Chang, U.S. Appl. No. 12/653,860, filed Dec. 18, 2009, Reply dated Jul. 23, 2010 to the Notice of Incomplete Reply of Apr. 12, 2010. 13 pages.

Siau, Chang, U.S. Appl. No. 12/653,860, filed Dec. 18, 2009, Office Action mailed May 9, 2011. 18 pages.

Siau, Chang, U.S. Appl. No. 12/653,860, filed Dec. 18, 2009, Response dated Oct. 27, 2011 to the Office Action of May 9, 2011. 16 pages.

Siau, Chang, U.S. Appl. No. 12/653,860, filed Dec. 18, 2009, Notice of Allowance and Fee(s) Due mailed Dec. 28, 2011. 16 pages.

* cited by examiner

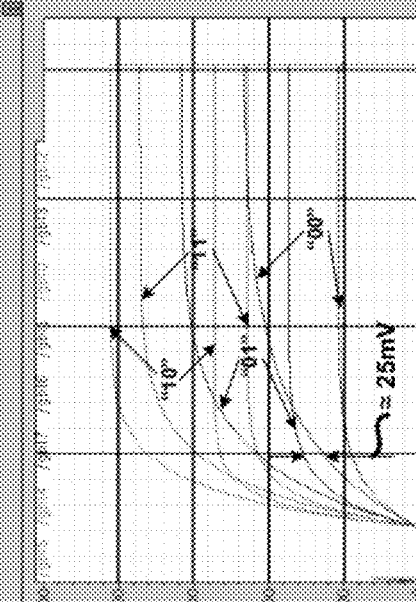

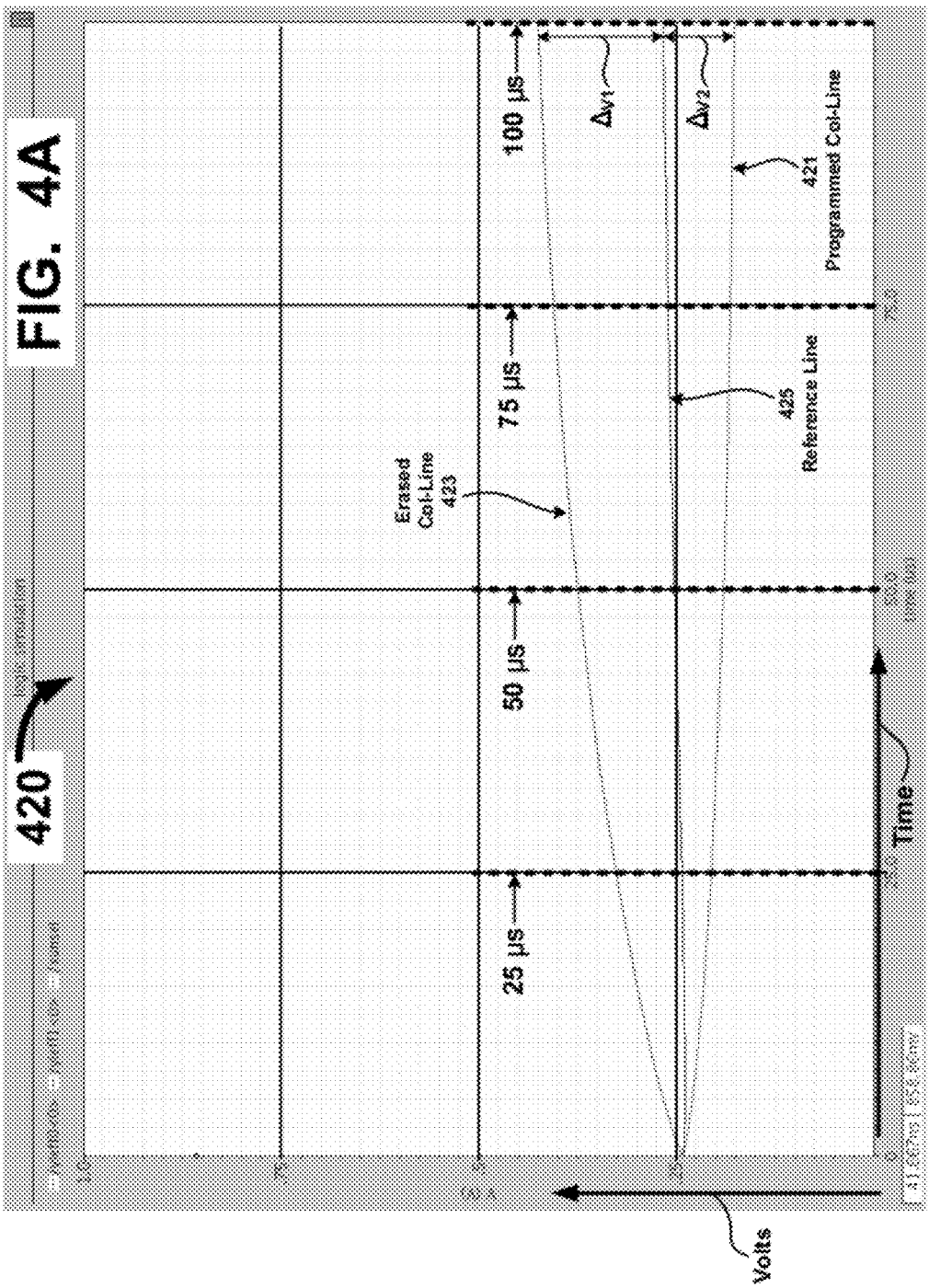

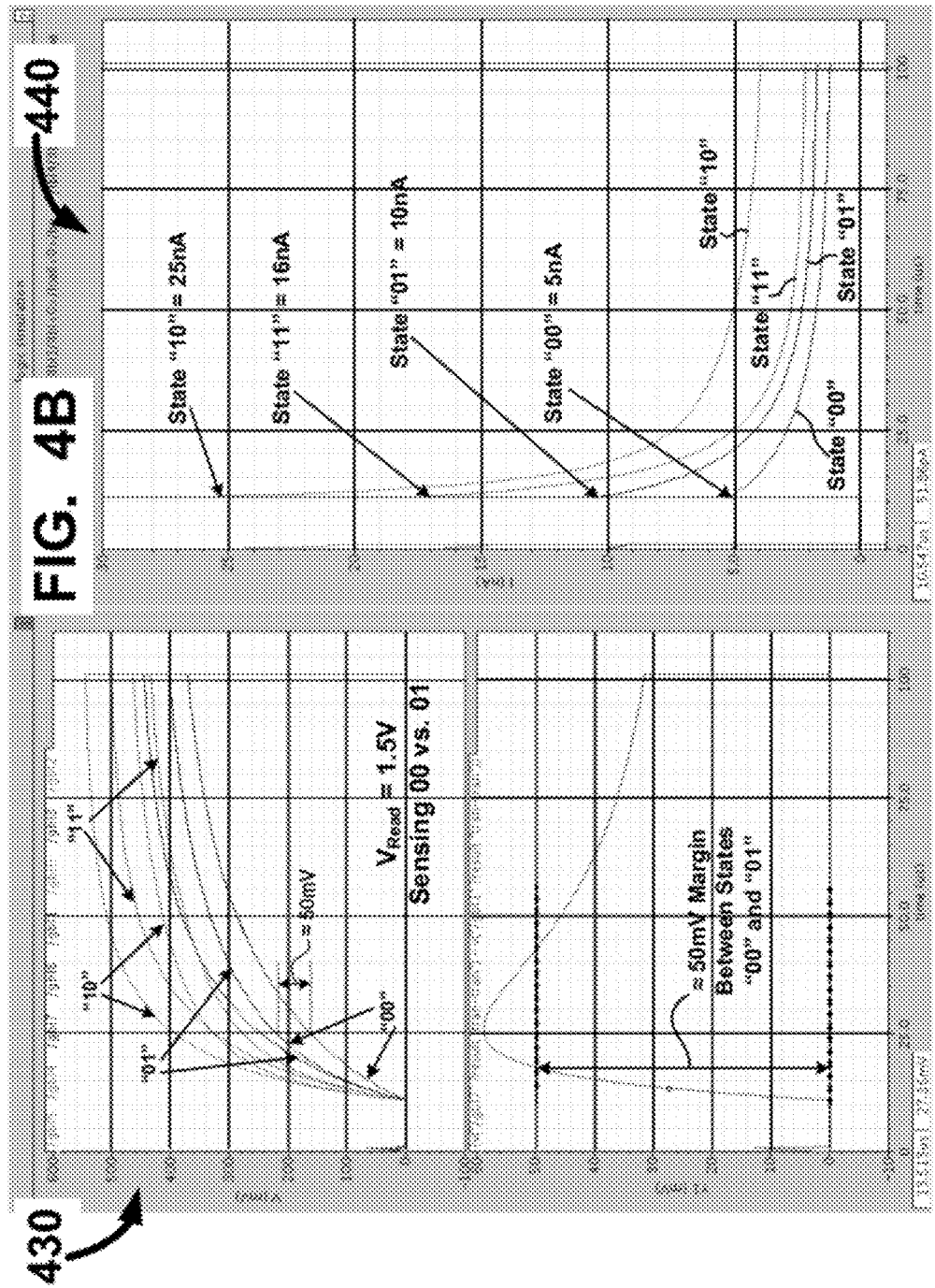

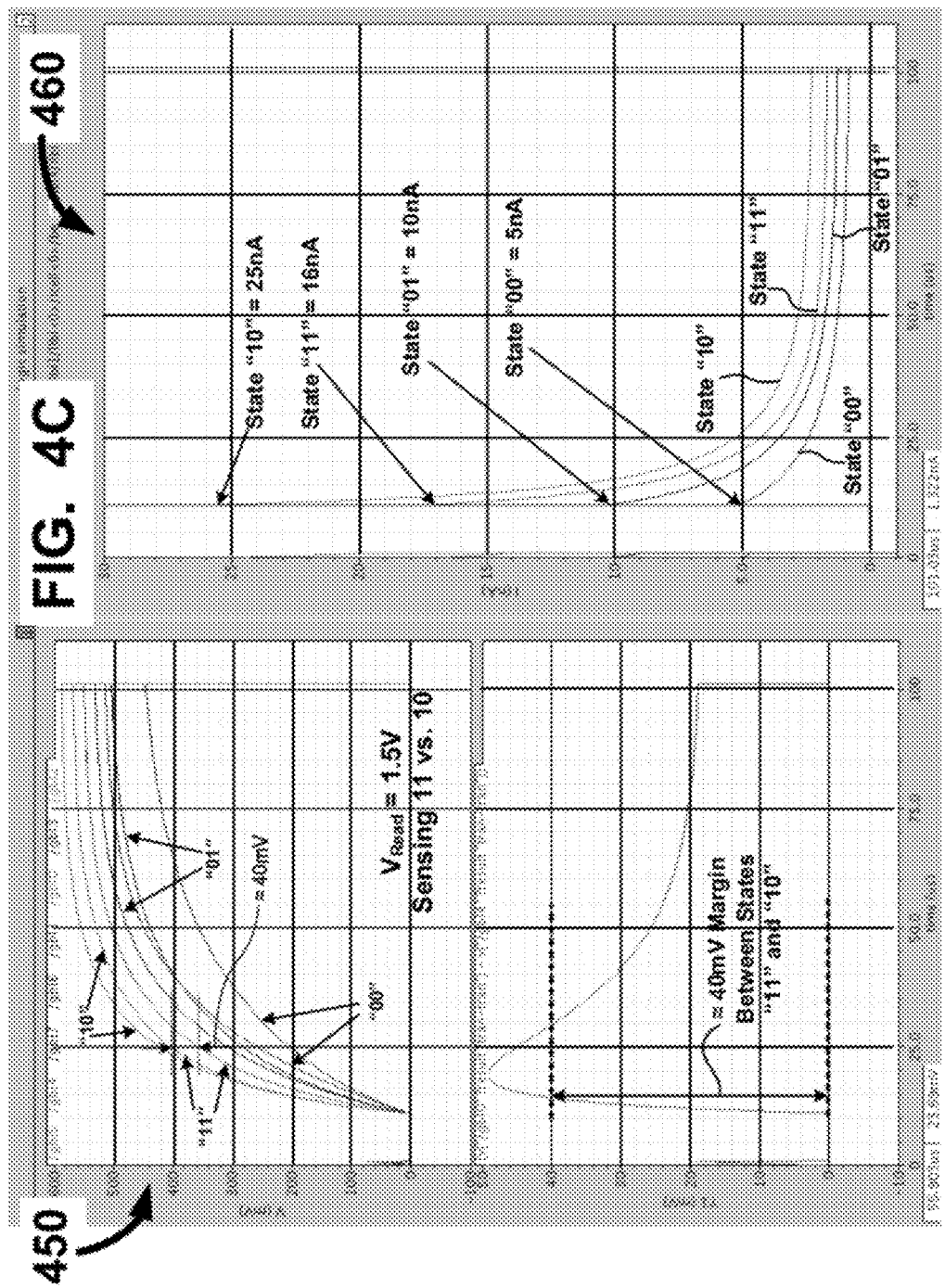

SIGNAL MARGIN IMPROVEMENT FOR READ OPERATIONS IN A CROSS-POINT MEMORY ARRAY

FIELD OF THE INVENTION

The present invention relates generally to semiconductors and memory technology. More specifically, the present invention relates to circuitry for sensing data in a non-volatile two-terminal cross-point memory array.

BACKGROUND

Sensing data in two-terminal memory cells that store data as a plurality of conductivity profiles can often require significant circuitry resources and die area to accurately sense read currents that are indicative of the stored data. One skilled in the art will appreciated that in large cross-point memory arrays, during the reading of one or more selected memory cells, other memory cells are either un-selected or half-selected. As a result, there can be leakage currents flowing in the half-selected and/or un-selected memory cells. The total current flowing in the array during the read operations is approximately the sum of all the leakage currents plus the read current(s) from selected memory cell(s).

Consequently, sense circuitry configured to sense a signal representing the read current must also be able to distinguish between the noise created by the leakage currents and the read current signal. Ideally, the signal-to-noise ratio S/N between the leakage currents and the read current should be as high as possible so that the sense circuitry can easily distinguish between the signal representing the read current and the signal(s) representing the noise (i.e., the leakage currents). The higher the S/N, the more accurate the data output from the sense circuitry during read operations to the array. Accurately sensing read currents can be exacerbated when each memory cell stores more than one bit of data (e.g., multi-level cell—MLC) because the sense amp circuitry must be able to accurately distinguish between the read current magnitudes for the stored data in a background of noise created by the aforementioned leakage currents. Accordingly, multi-level sensing (MLS) is required to accurately differentiate read currents that represent stored data (e.g., "00", "01", "10" "11").

Turning now to FIG. 1A, a conventional configuration 150 depicts a schematic view of a cross-point array including a plurality of row array lines 110, a plurality of column array lines 112, and a plurality of two-terminal memory cells 100 positioned at an intersection of one of the row lines 110 with one of the column lines 112. Each memory cell 100 includes a first terminal 103 electrically coupled with only one row line 110 and a second terminal 105 electrically coupled with only one column line 112. Here, address decoding circuitry (not shown) generates signals that accesses the memory cell(s) 100 for data operations (e.g., read and write operations). Those signals are operative to electrically couple a read voltage source 130 and an un-select voltage source 140 with row array lines 110 via switches R0-R3. Switches R0-R3 select voltages sources 130 and 140 based on the state of their respective control signals ra-rd. A decoded address can determine which of the controls signals ra-rd goes active and which remain inactive.

Control signal ra for switch R0 goes active (e.g., logic "1") and switch R0 selects read voltage source 130 and applies a read voltage potential to the row 0 array line 110 causing array line 110 to become a selected array line 110' as depicted by heavy line. Memory cells 100 on the row 0 array line 110' become selected memory cells 100' and have a read voltage potential $V_{Read}$ (e.g., 1.5V) applied to their respective terminals 103. Control signals rb-rd are inactive (e.g., logic "0") and their respective switches R1-R3 select the un-select voltage source 140 and apply an un-select voltage potential $V_{UN\text{-}SELECT}$ (e.g., 0V) to the row 1-3 array lines 110 such that the un-select voltage $V_{UN\text{-}SELECT}$ is applied to the terminals 105 of the memory cells 100 in those rows.

Switches C0-C3 for column array lines 112 select between a pre-charge voltage source 160 and a floating potential 180 based on a state of their respective control signals ca-cd. Pre-charge voltage source 160 is selected by the switches C0-C3 when control signals ca-cd are inactive (e.g., logic "0") and the column array lines 112 are pre-charge to a pre-charge voltage $V_{Pre\text{-}Charge}$ (e.g., 0V).

Turning now to FIG. 1B, after the read voltage $V_{Read}$ is established on the selected row array line 110', the control signals ca-cd go active (e.g., logic "1") and switches C0-C3 select floating potential 180 and the column array lines 112 are allowed to float to a voltage potential $V_{Float}$. The selected memory cells 100' have a potential difference across their terminals (103, 105) due to the read voltage potential $V_{Read}$ on the terminals 103 and the voltage potential $V_{Float}$ on the terminals 105. Consequently, a read current $I_{Read}$ whose magnitude depends on the resistive state of data stored in the selected memory cell 100' and the potential difference across the terminals (103, 105) flows through each selected memory cell 100' and charges up the floating column array lines 112 to a voltage that depends on a RC time constant created by the resistance and capacitance of each of the column array lines 112. For example, given an applied voltage of 1.5V across the terminals (103, 105), if a programmed state is a high resistance (e.g., a logic "0"), and an erased state is a low resistance (e.g., a logic "1"), then a magnitude of the read current $I_{Read}$ is low for the programmed state and is higher for the erased state.

Circuitry 0-3 is electrically coupled with the column lines 112 and output signals s1-s3 that are indicative of the magnitude of the currents flowing through the array lines 112. Circuitry 0-3 can include a current mirror, a current-to-voltage (I/V) converter, a voltage-to-current (V/I) converter, for example, that outputs the signals s1-s3 which are electrically coupled with sense amp circuitry and compared with a reference signal such as a reference current, reference voltage, or the like. The sense amps generate output signals that are indicative of the data stored in the memory cells 100' in selected row line 110'. The conventional configuration 150 depicts a page mode operation in which several memory cells 100' on the same row line 110' are read at the same time and the read current signals from each memory cell 100' is sensed by sense amp circuitry 0-3 that is electrically coupled with each cells 100' respective column line 112. Although only 4 memory cells 100 are depicted in each row 110 and column 112, one skilled in the art will appreciate that there can be several hundred to several thousand, or more memory cells 100 in each row 110 and column 112. For example, a page can be a row 110 with 1024 memory cells 100 (e.g., 1K bits: column 0-column 1023) or a row 110 with 32K memory cells 100 for a 32K bits. Regardless of the number of memory cells 100 being read in page mode, it is desirable to simultaneously sense all the memory cells 100 being read in order to obtain a faster read rate so that read data is output to a data bus or the like with the lowest latency possible.

The charging voltage on the column array lines 112 as a function of time for the conventional configuration 150 is depicted in FIG. 2A. Here, a programmed col-line 121 and an erased col-line 123 depict charging characteristics for column lines 112 that are electrically coupled with a terminal 105 of a selected memory cell 100' that stores data in the programmed state (i.e., 121) or the erased state (i.e., 123), respectively. Although a read operation can access a single bit of data (e.g., only one selected memory cell 100'), a typical read operation will access a larger set of data, such a as a page of data (e.g., 32 k bits). In some applications, multiple pages of data will be read at the same time or at substantially the same time. The multiple pages can be within the same array or distributed among a plurality of arrays. In FIG. 2A, a graph 220 depicts a time window for sensing a page of data is between about 25 μs and about 100 μs. Accurately sensing the page data within the time window requires sense amp circuitry that can sense a difference in voltage between the programmed col-line 121 and the erased col-line 123 versus a reference voltage on a reference column-line (not shown). In the time window depicted, the voltage on the erased col-line 123 has a greater rise in amplitude when compared to the programmed col-line 121. At the 100 μs time point, a voltage difference $\Delta_V$ between the erased col-line 123 and the programmed col-line 121 is approximately 25 mV. The rate of change in the erased col-line 123 voltage (e.g., the increase in 123 from 25 μs to 100 μs) during the time window makes it difficult to properly bias the sense amp circuitry. Moreover, in some applications each memory cell 100 is configured to store more than one bit of data (e.g., multi-level cell "MLC"). Multiple levels of data (e.g., "00", "01", "10", and "11") stored in each cell 100 requires sense amp circuitry that can implement multi-level sensing (MLS). Preferably, variations in voltage within the sensing time window for multiple states should be as low as possible so the sense amp circuitry can be biased to accurately distinguish differences between multiple states.

In FIG. 2B, a graph 260 depicts read current magnitudes over time for states "00", "01", "10", and "11"; whereas, a graph 240 depicts a voltage margin of 25 mV between states "00" and "01" during a MLS read operation. As can be seen in the upper portion of graph 240, there is overlap in the voltage over time curves for the states "00" and "01" with the curves for state "00" intersecting the curves for state "01". Those overlapping voltages make it difficult to properly bias sense amp circuitry and can lead to errors in MLS.

There are continuing efforts to improve signal sensing technology for non-volatile memory devices.

BRIEF DESCRIPTION OF THE DRAWINGS

Various examples are disclosed in the following detailed description and the accompanying drawings.

FIG. 2B depicts a graph of conventional voltage signal margins for multiple states during a read operation for the conventional configurations depicted in FIGS. 1A and 1B;

FIG. 4A depicts a graph of a flattened erase voltage over time for the configurations depicted in FIGS. 3A and 3B;

FIG. 4B depicts graphs of improved voltage signal margins for multiple level sensing during a first cycle of a read operation for the configurations depicted in FIGS. 3A and 3B;

FIG. 4C depicts graphs of improved voltage signal margins for multiple level sensing during a second cycle of a read operation for the configurations depicted in FIGS. 3A and 3B;

Figure 1A:
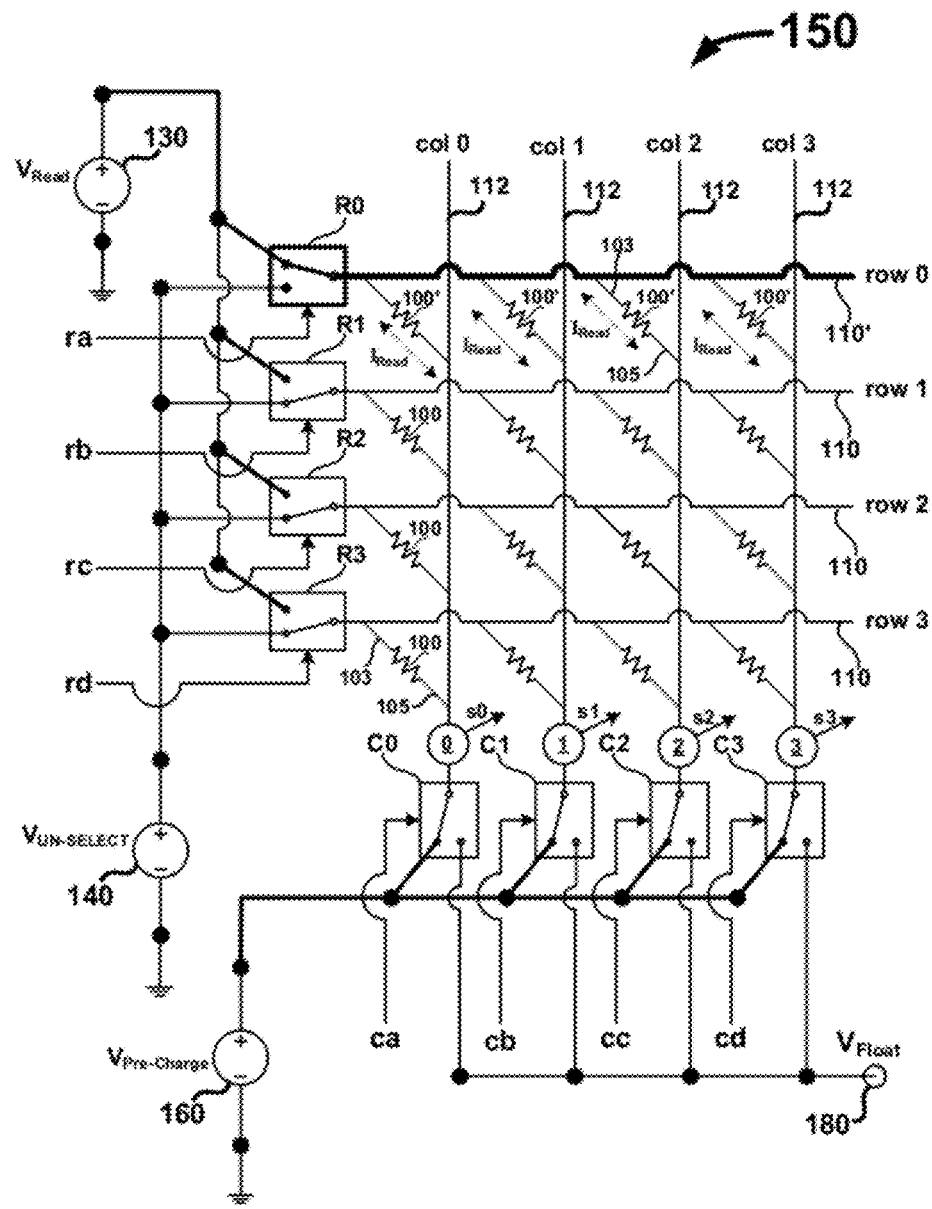
FIG. 1A depicts a schematic view of a pre-charge configuration for a conventional bias scheme for a two terminal cross-point array during a read operation.
Figure 1B:
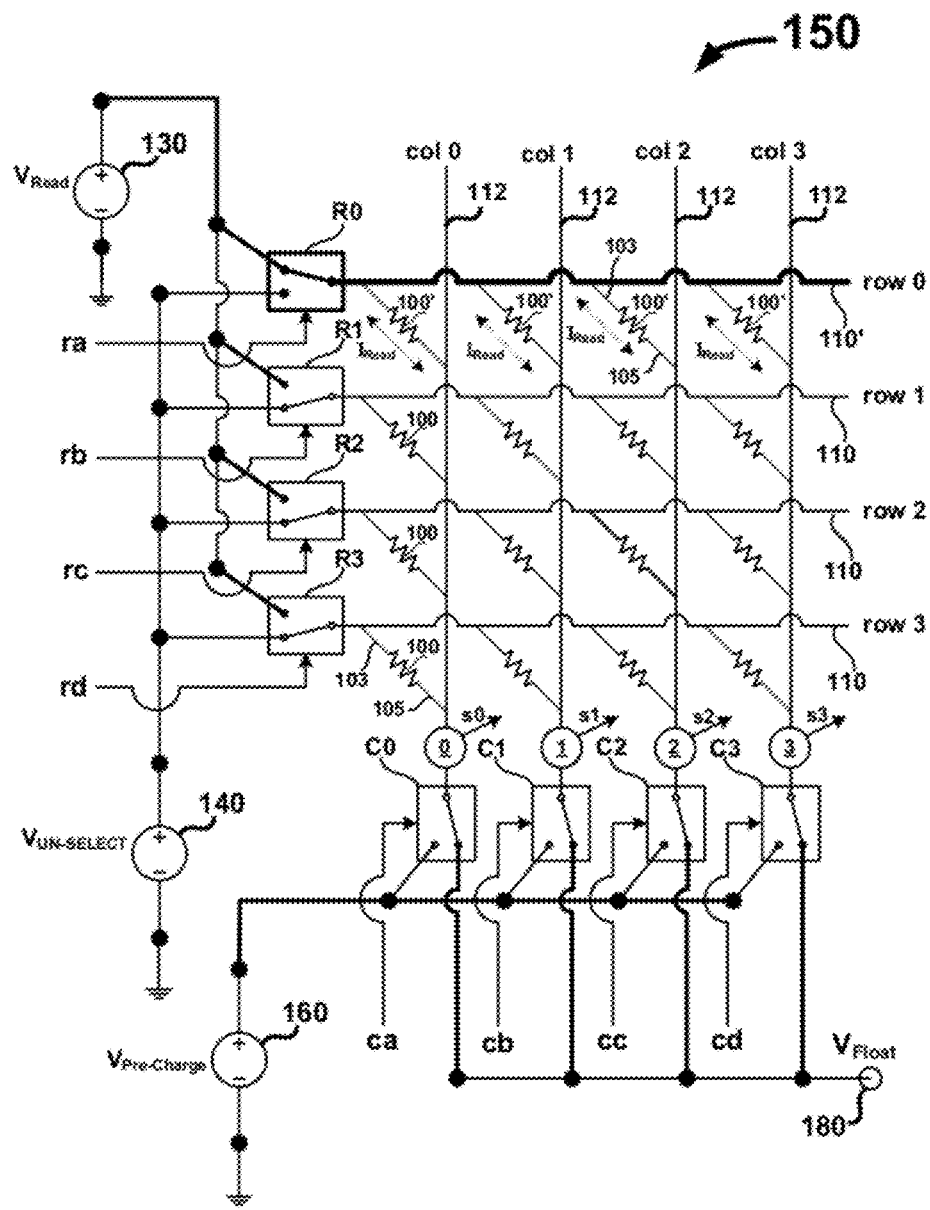
FIG. 1B depicts a schematic view of a floating configuration for a conventional bias scheme for a two terminal cross-point array during a read operation.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, entitled "Memory Using Mixed Valence Conductive Oxides," and published as U.S. Pub. No. US 2006/0171200 A1, is hereby incorporated by reference in its entirety and for all purposes and describes non-volatile third dimensional memory elements that may be arranged in a two-terminal, cross-point memory array. The memory elements can be a component of a memory cell that includes electrically in series with the memory element, other structures including but not limited to a non-ohmic device (NOD) and electrodes. New memory structures are possible with the capability of this third dimensional memory array. The technology allows for the emulation of other memory technologies by duplicating the interface signals and protocols, while accessing the third dimensional memory array. The third dimensional memory array may emulate other types of memory, providing memory combinations within a single component. In at least some embodiments, a two-terminal memory cell can be configured to change conductivity when exposed to an appropriate voltage drop across the two-terminals. The memory cell can include an electrolytic tunnel barrier and a mixed valence conductive oxide (e.g., a memory element) in some embodiments, as well as multiple mixed valence conductive oxide structures in other embodiments. A voltage drop across the electrolytic tunnel barrier can cause an electrical field within the mixed valence conductive oxide that is strong enough to move oxygen ions out of a mixed valence conductive oxide, according to some embodiments.

In some embodiments, an electrolytic tunnel barrier and one or more mixed valence conductive oxide structures do not need to operate in a silicon substrate, and, therefore, can be fabricated (e.g., BEOL) above circuitry being used for other purposes (e.g., fabricated FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½–VW1 to the Y-direction line), the memory cell can switch to a low resistive state. When a second write voltage, VW2, is applied across the memory cell (e.g., by applying ½ VW2 to the X-direction line and ½–VW2 to the Y-direction line), the memory cell can switch to a high resistive state. Memory cells using electrolytic tunnel barriers and mixed valence conductive oxides can have VW1 opposite in polarity from VW2.

Figure 3A:
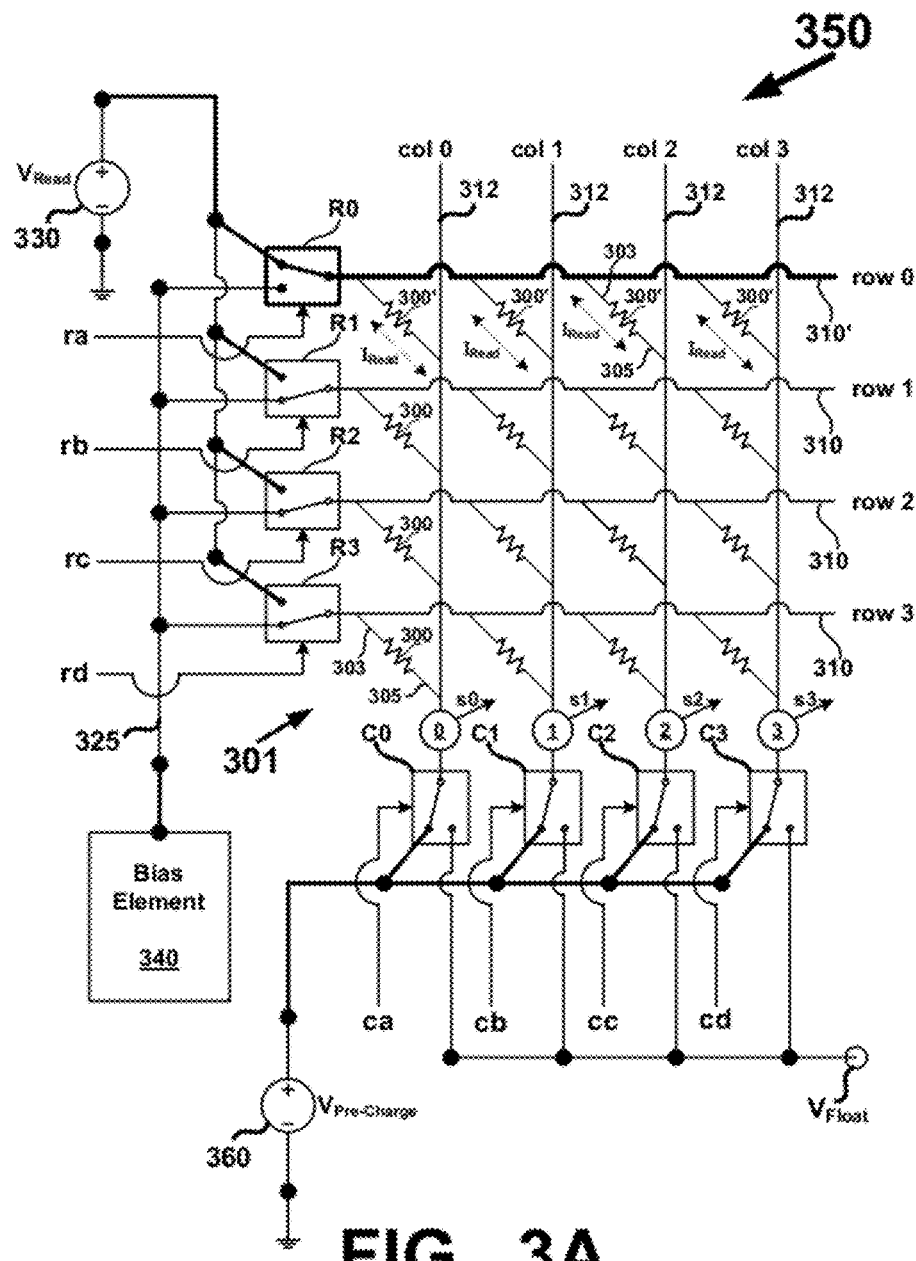
FIGS. 3A and 3B depict a schematic view of configuration for an improved biasing scheme for a two terminal cross-point array during a read operation.

Turning to FIG. 3A, a configuration 350 includes an two-terminal cross-point array 301 that includes a plurality of two-terminal memory cells 300 with each memory cell including a first terminal 303 and a second terminal 305. The array 301 includes a plurality of row array lines 310 (row 0-3) and a plurality of column array lines 312 (col 0-3) with a single memory cell 300 positioned at an intersection of a row line 310 and a column line 312. Each first terminal 303 is electrically coupled with only one of the row lines 310 and each terminal 305 is electrically coupled with only one of the column lines 312. Here switches R0-R3 electrically couple a read voltage source 330 or a bias element 340 with the row array lines 310 based on a state of their respective control signals ra-rd. Switches C0-C3 electrically couple pre-charge voltage source 340 or a floating voltage potential $V_{Float}$ with the column array lines 312 based on a state of their respective control signals ca-cd. In FIG. 3A, for purposes of explanation, an address has been decoded (e.g., an address for a read operation to the array) to select the memory cells 300 on row 0 for a page read operation and the control signal ra goes active (e.g., logic "1") and switch R0 selects the read voltage source 330 and applies a read voltage potential $V_{Read}$ to the terminals 303 of memory cells in row 0 which are denoted as selected memory cells 300' on selected row line 310'. The decoded address also causes control signals ca-cd on switches C0-C3 to go active and select pre-charge voltage source 360 which applies a pre-charge voltage $V_{Pre-Charge}$ (e.g., 0V) to the column lines 312. A resulting potential difference across the terminals (303, 305) of the selected memory cells 300' generates a read current $I_{Read}$. The remaining cells 300 in the array 301 are un-selected and can generate leakage currents caused by a potential difference across their terminals (303, 305).

Figure 3B:
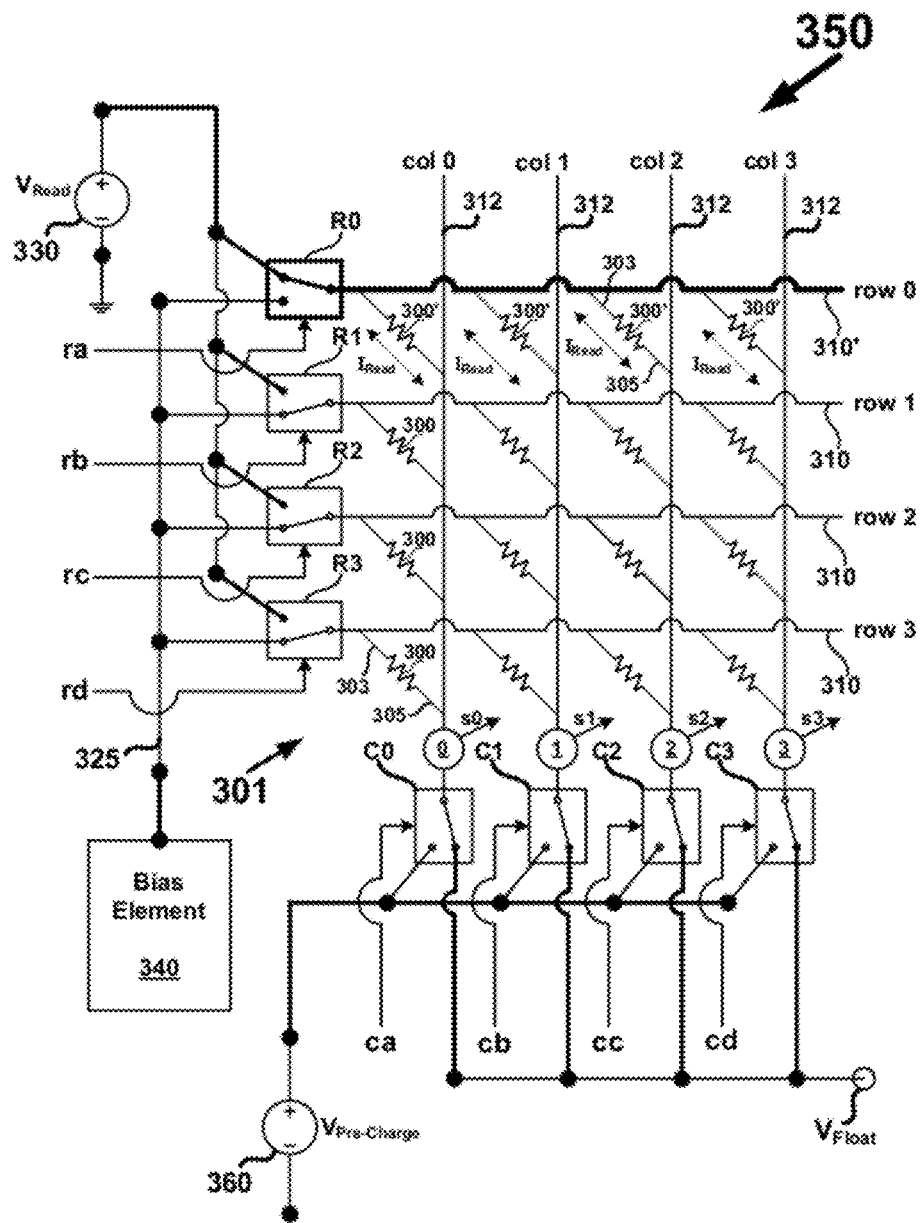

Referring now to FIG. 3B, the control signals ca-cd go inactive (e.g., logic "0") and switches C0-C3 select the floating voltage potential $V_{Float}$. Circuitry 0-3 is electrically coupled with the column lines 312 and generate output signals s1-s3 that are indicative of the magnitude of the currents flowing through column lines 312. Circuitry 0-3 can include a current mirror, a current-to-voltage (I/V) converter, a voltage-to-current (V/I) converter, for example, that outputs the signals s1-s3 which are electrically coupled with sense amp circuitry (not shown) and subsequently compared with one or more reference signals such as a reference current, a reference voltage, or the like. The sense amp circuitry generate output signals that are indicative of the data stored in the memory cells 300' in selected row line 310'.

The bias element 340 applies a bias signal (e.g., a bias voltage) on the terminals 303 of the un-selected memory cells 300 in the column lines 312 and that bias signal is operative to "flatten" the column line 312 voltage curve as will be described below in regards to FIG. 4A. That is, the voltage rise on an erased column line is reduced so that the sense amp circuitry is properly biased and can output accurate read data for single level sensing (SLS) and multi-level sensing (MLS). This results in a better behaving sense amplifier. By controlling the column line 312 voltage during read operations a granularity of the sense amplifier circuitry is improved and that granularity allows for MLS in memory cells 300 that store multi-bit data (e.g., MLC). For example, each memory cell 300 can store two-bits of data (e.g., 00, 01, 10, and 11). Consequently, each memory cell 300 is operative to store data as four conductivity profiles (e.g., four different resistive states) that can be sensed by the sense amp circuitry and output as one of four possible data values.

Figure 3C:
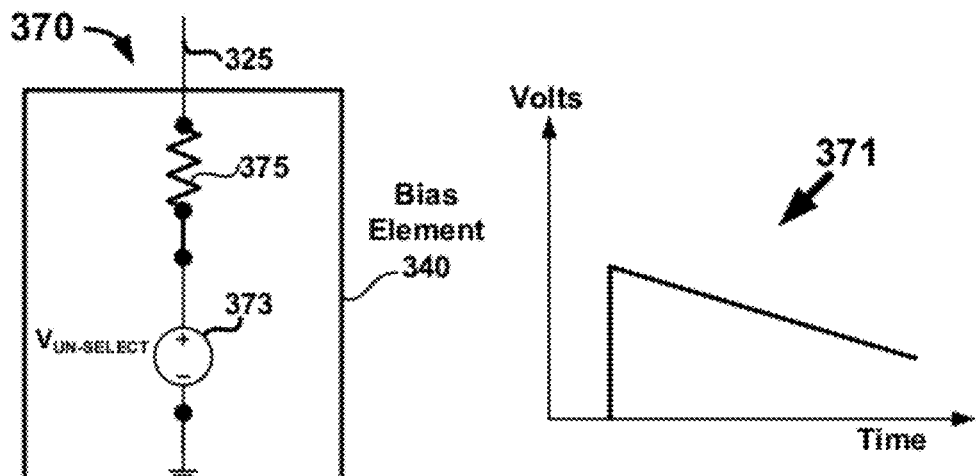
FIGS. 3C-3E depict schematic diagrams on the left and their associated voltage over time curves on the right for a bias element for biasing un-selected row array lines during a read operation.
Figure 3D:
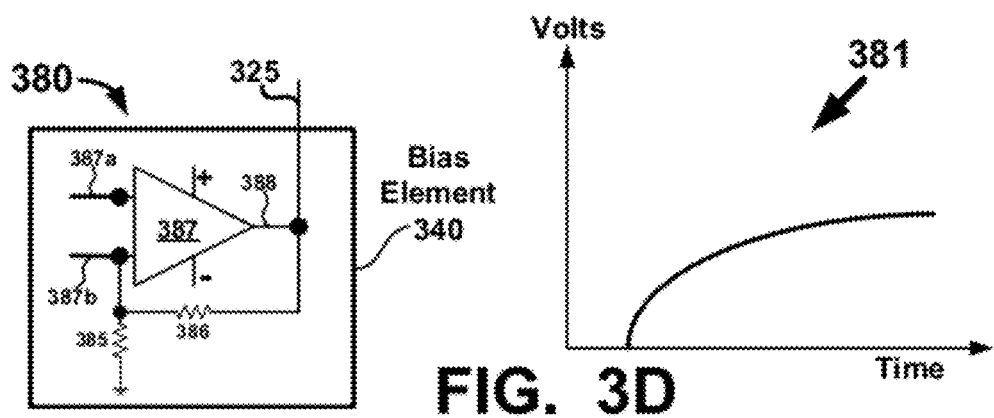
Figure 3E:
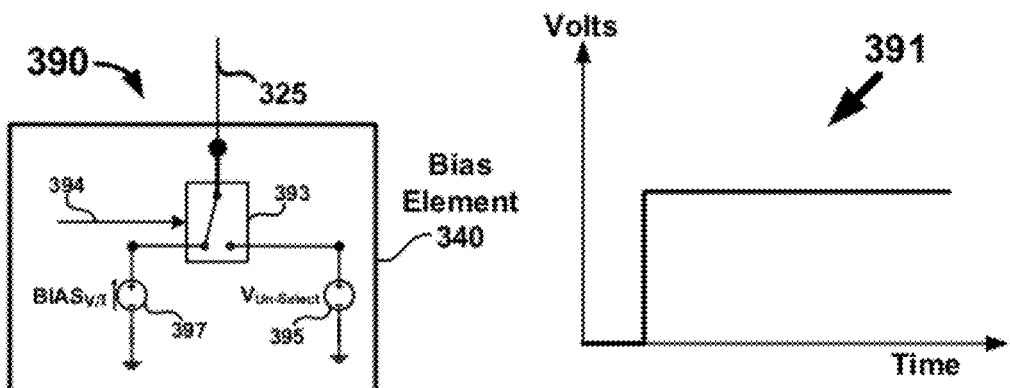

Reference is now made to FIGS. 3C-3E where three schematics depict different examples of configurations for the bias element 340 and three graphs depict changes in applied voltage over time for each configuration. In that the bias element 340 applies a voltage bias to the un-selected row lines 110, one skilled in the art will appreciate that there are a variety of techniques that can be used to apply a bias voltage to un-selected row lines 110 and the present invention is not limited to examples depicted in FIGS. 3C-3E.

In FIG. 3C, a first configuration 370 of the bias element 340 comprises a voltage source 373 electrically coupled with a resistor 375. The resistor 375 is electrically coupled with node 325 of switches R0-R3. A graph 371 depicts the voltage characteristics of the row lines 110 resulting from the bias element 340 in configuration 370.

In FIG. 3D, a second configuration 380 of the bias element 340 can comprises an op-amp circuit 387 (or other similar circuitry) including inputs 387a and 387b and an output 388 that drives a bias voltage on the node 325 and also forms a feedback path to input 387b via feedback resistor 386 that is electrically coupled with resistor 385. Input 387a can be electrically coupled with data access circuitry that applies a signal (e.g., an input voltage of predetermined magnitude) to the input 387a during read operations to the array 301. A graph 381 depicts the voltage characteristics of the row lines 110 resulting from the bias element 340 in configuration 380.

In FIG. 3E, a third configuration 390 of the bias element 340 comprises a switch 393 having an output electrically coupled with the node 325 and a control input 394 that selects between two sources, an un-select voltage source 395 and a bias source 397. Here, the un-select voltage source 395 can apply a voltage potential (e.g., 0V) when the control input 394 is inactive. When the control input 394 is active, the switch 393 can select the bias source 397. The bias source 397 can be a voltage source as depicted by the +/− signs or a current source as depicted by the arrow. A graph 391 depicts the voltage characteristics of the row lines 110 resulting from the bias element 340 in configuration 390.

Figure 3F:
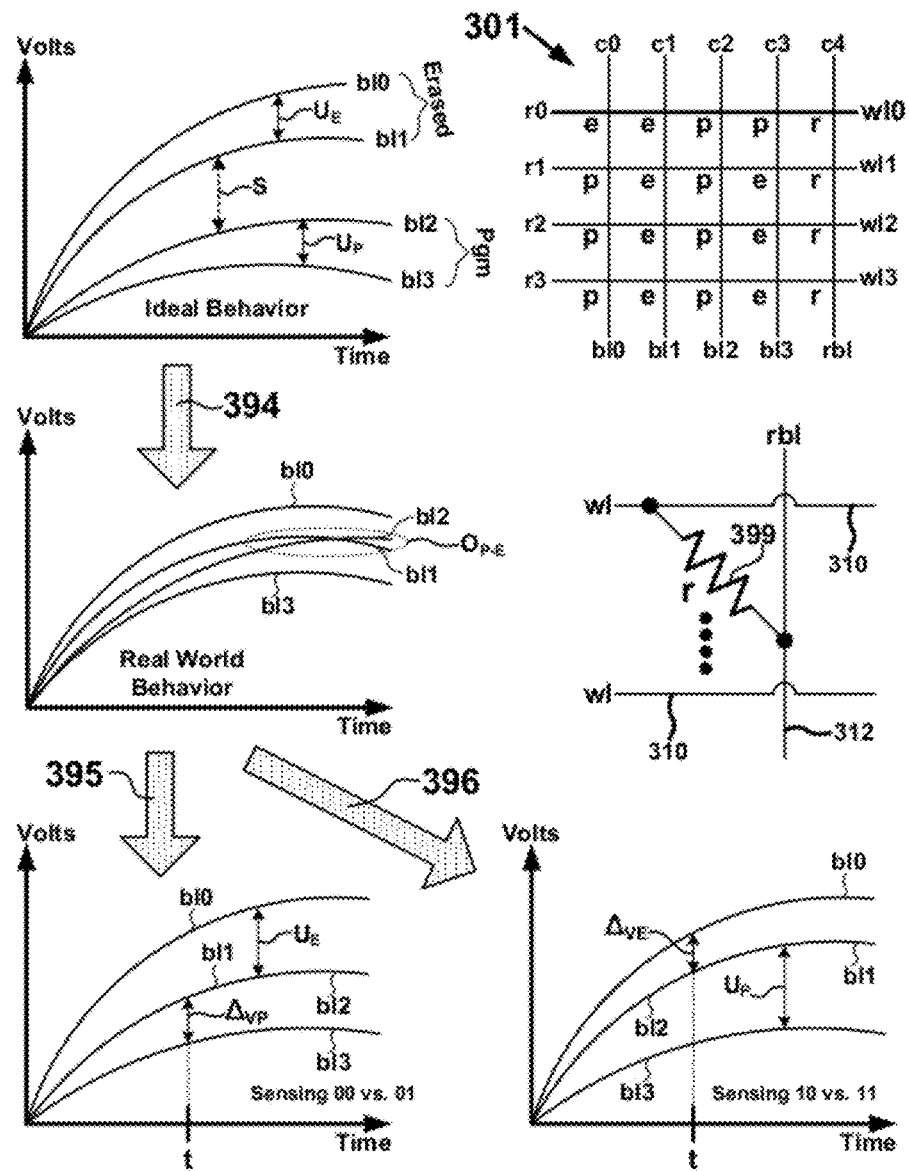
FIG. 3F depicts column array line behavior under ideal and real world conditions for a page mode read operation and corrected voltage curves resulting from a bias voltage applied to un-selected row array lines.

Turning now to FIG. 3F the array 301 is depicted during a page mode read operation to word line 0 (wl0) which corresponds to row array line r0 in array 301. In row r0, selected memory cells 300' are denoted as erased cells "e" in columns c0 and c1 and programmed cells "p" in columns c2 and c3. Ideally, the behavior of MLC erased or programmed cells is depicted in the graph to the immediate left of the array 301 where erased cells in bit lines bl0 and bl1 have two distinct curves but with some uncertainty $U_E$ as to whether the erased cells in the page stores a hard erased value (e.g., "11") or a soft erased value (e.g., "10"). Similarly, programmed cells in bit lines bl2 and bl3 have two distinct curves but with some uncertainty $U_P$ as to whether the programmed cells in the page stores a hard programmed value (e.g., "01") or a soft programmed value (e.g., "00"). Moreover, in an ideal scenario there is a distinct voltage separation S between the curves for the programmed and erased states.

However, in curves for real world behavior 394, during the page mode read there is overlap $O_{P-E}$ between the curves for the programmed and erased states that can cause uncertainty in the ability of sense amp circuitry to distinguish via MSL the voltages indicative of the programmed and erased states. Here, the curves for bl1 and bl2 overlap in the time window for sensing read data and that overlap can result in the inability to accurately sense data. Referring back to the array 301, the real world behavior is due to leakage currents in the un-selected memory cells 300. The magnitude of those leakage currents depends in part on the resistive state stored in each un-selected memory cell 300 in the bit line being sensed. For example, for the selected erased cell "e" in bl0, the best case scenario for the total current (e.g., $I_{Leakage}+I_{Read}$) is when all the un-selected memory cells 300 in bl0 are in the programmed state "p" (e.g., high resistance) because leakage current is lower for high resistances and the un-selected memory cells 300 will generate a lower magnitude of leakage current in the programmed state "p". As another example, for the selected erased cell "e" in bl1, the worst case scenario for the total current is when all the un-selected memory cells 300 in bl0 are in the erased state "e" (e.g., low resistance) because leakage current is higher for low resistances and the un-selected memory cells 300 will generate a higher magnitude of leakage current in the erased state "e" and the magnitude of those leakage currents can be difficulty to distinguish from the read current from the selected erased memory cell 300'.

As yet another example, for the selected programmed cells in bl2 and bl3, the worst case scenario for selected programmed cell in bl2 is when all the un-selected cells 300 in bl2 are in the programmed state "p" (e.g., high resistance) because all the leakage currents are lower due to the high resistance and it can be more difficult to distinguish the read current from the selected programmed cell 300' from the leakage currents of the un-selected programmed cells 300; whereas, the best case scenario for selected programmed cell in bl3 is when all the un-selected cells 300 in bl3 are in the erased state "e" (e.g., low resistance) because all the leakage currents are higher due to the low resistance.

Corrected behavior 395 is due to the application of the bias voltage from bias element 340. Bias element 340 is operative to flatten the curves and to provide a distinct voltage difference $\Delta_{VP}$ between programmed states in the cells in bl2 and bl3 so that a reference voltage can be used to by the sense amps to distinguish between the "00" and "01" programmed states. Here, the uncertainty $U_E$ between the erased cells in bl0 and bl1 is irrelevant because the erased states "11" and "10" are not being sensed and the bias element 340 has flattened the curve for the bl2 voltage so that the curve no longer overlaps with the bl1 voltage.

Corrected behavior 396 is due to the application of the bias voltage from bias element 340 which is operative to flatten the curves and to provide a distinct voltage difference $\Delta_{VE}$ between erased states in the cells in bl0 and bl1 so that a reference voltage can be used to by the sense amps to distinguish between the "11" and "10" programmed states. Here, the uncertainty $U_P$ between the programmed cells in bl2 and bl3 is irrelevant because the programmed states "00" and "01" are not being sensed and the bias element 340 has flattened the curve for the bl1 voltage so that the curve no longer overlaps with the bl2 voltage.

In some applications, the array 301 can include at least one reference bit line rbl that includes a plurality of reference memory cells R with each memory cell having a first terminal electrically coupled with only one of the row lines 310 and a second terminal electrically coupled with the reference bit line rbl as depicted in column c4 of FIG. 3F. During a read operation, such as a page mode read, the current flowing through reference bit line rbl can be sensed and used to generate a reference signal (e.g., a reference current or voltage) that can be used by the sense amps in the non-reference bit lines bl0-bl3 as will be described in greater detail below.

Figure 2A:
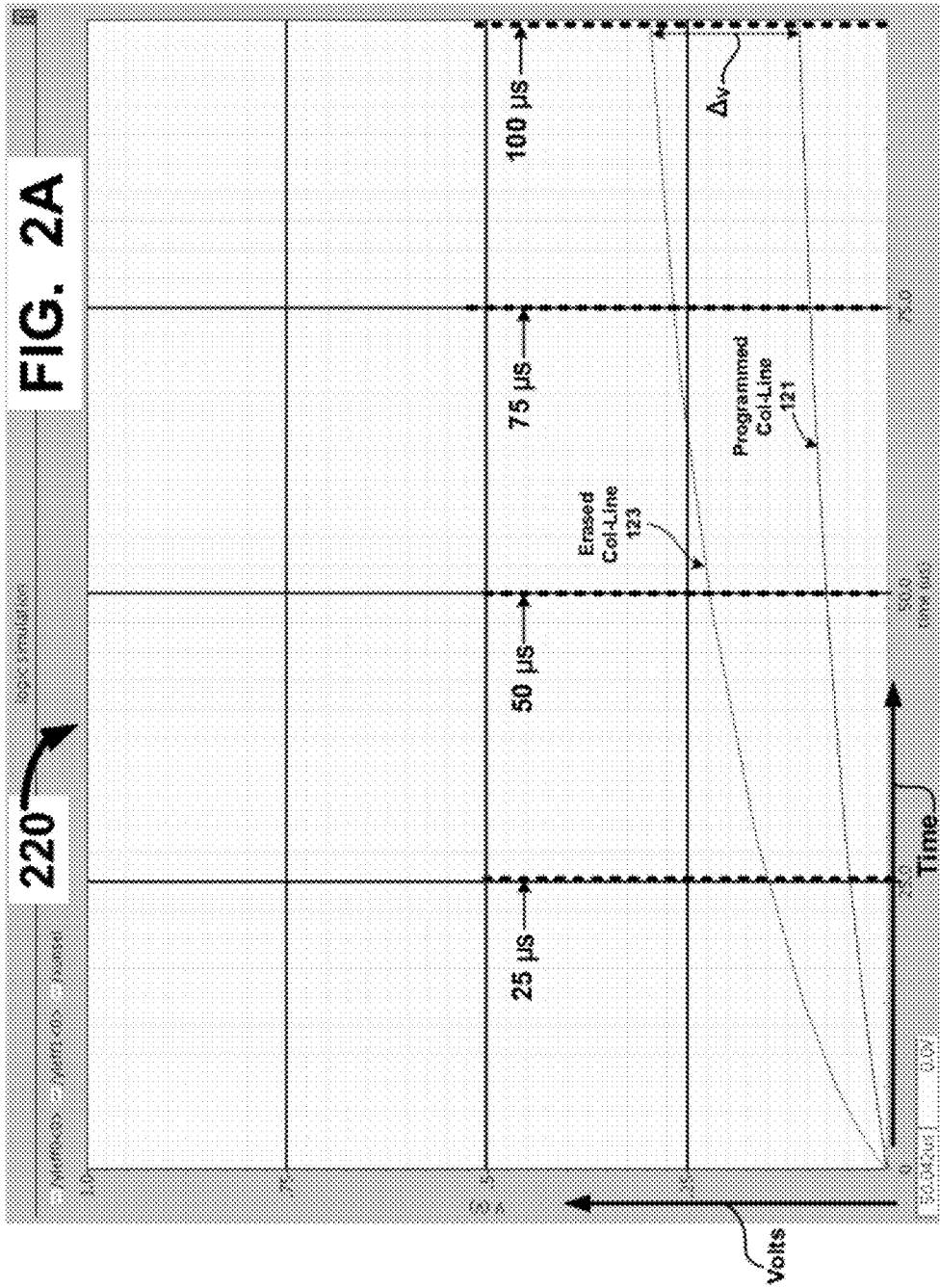
FIG. 2A depicts a graph of program and erase voltages over time for the conventional configurations depicted in FIGS. 1A and 1B.

Moving on to FIG. 4A, a graph 420 depicts voltage on a Y-axis and time on an X-axis. Here, in a time window from about 25 µs to about 100 µs a bit-line voltage characteristic for an erased col-line 423, a programmed col-line 421, and a reference line 425 are depicted. Although the voltage of the erased col-line 423 rises during the time window, the increase in voltage of the erased col-line 423 from the 25 µs time point to the 100 µs time point is less than that depicted for the conventional configuration of FIG. 2A. Moreover, the bias element 340 has elevated the voltage level above the 0V level on the Y-axis (e.g., initial voltage is approximately at 25 mV). The use of the bias element 340 flattens the curve for the erased col-line 423 and is operative to shift the voltage curves for the erased col-line 423 and programmed col-line 421 so that a voltage for the reference line 425 is positioned between the voltage curves for the erased col-line 423 and programmed col-line 421. Sense amp circuitry receiving signals representative of the voltages on lines 421, 423, and 425 can use the voltage on the reference line 425 to sense a voltage difference $\Delta_{V1}$ between the erased col-line 423 and the reference line 425 and to sense a voltage difference $\Delta_{V2}$ between the reference line 425 and the programmed col-line 421. For example, a reference signal (e.g., a reference voltage $V_{Ref}$) can be one input to the sense amp circuitry and the voltages on the column line 312 can be another input. Using the reference signal as a basis for comparison, the sense amp circuitry can determine if the voltage on the column line is above or below $V_{Ref}$. If above $V_{Ref}$ then the voltage can be indicative of a column line with an erased memory cell 300' (e.g., erased col-line 423). If below $V_{Ref}$ then the voltage can be indicative of a column line with a programmed memory cell 300' (e.g., programmed col-line 421).

The reference line 421 can be a column of reference memory cells in the array 301 (e.g., see 301 and 399 in FIG. 3F) that have a similar or identical structure to the memory cells 300 but store a reference resistance value that is not altered after being set (i.e., the reference resistance is not overwritten). During a data operation on the array 301 (e.g., a read operation or page mode read operation) the total current flowing through the reference line can be converted to a signal (e.g., the reference voltage $V_{Ref}$) to be used by the sense amp circuitry to compare with the current signals from the column lines 312 to determine the read current for selected memory cells 300'. During write operations to the array 301, a write voltage is not applied across the terminals of the reference memory cells to prevent the overwriting of the reference resistance values stored in the reference memory cells. The current signals from the column lines 312 can be converted to a voltage signal (e.g., by an I/V converter) for comparison with the reference signal or can remain in the current domain and be compared with the reference signal. Reference cells that can be programmed to reference resistance state (e.g., to a mid-point between a "0" state and a "1" state), are described in "Two Terminal Memory Array Having Reference Cells," U.S. application Ser. No. 10/895,218, filed Jul. 11, 2006, now U.S. Pat. No. 7,075,817, which is incorporated herein by reference in its entirety and for all purposes. Read current sensing using one or more reference signals (e.g., reference voltages) is described in "Low Read Current Architecture For Memory," U.S. application Ser. No. 11/881,500, filed Jul. 26, 2007, now U.S. Pat. No. 7,701,791, which is incorporated herein by reference in its entirety and for all purposes.

In FIG. 4B, a graph 440 depicts read current magnitudes on a Y-axis versus time on an X-axis for memory cells 300 storing multiple states "00", "01", "10", and "11". Graph 440 depicts different read current magnitudes for the different resistive values of the multiple states. In a graph 430, an upper graph depicts curves of voltage versus time for multiple states "00", "01", "10", and "11", and a lower graph depicts a voltage margin between states "00" and "01". In the upper graph, a first MLS read operation applies a read voltage $V_{Read}$=1.5V (e.g., using voltage source 330) to a selected row 310' and applies a bias voltage (e.g., 25 mV) via bias element 340 to un-selected rows 310. The column lines 312 are pre-charged (e.g., to 0V) via voltage source 360 and are then floated to $V_{Float}$. The resulting voltage curves show overlap between the states that must be resolved by the sense circuitry in order to determine what state each memory cell 300' on the selected row line 310' is storing. The leakage current in the column 312 of each selected memory cell 300' is in is determined in part by the resistive state stored in the un-selected memory cells 300 in that column 312 as was descried above in regards to FIG. 3F. The application of the bias voltage by the bias element 340 is operative to shift the voltage curves for the "00" and "01" states and remove overlap between those states and creating a voltage margin of approximately 50 mV within the time window for sensing the page data. During a sense operation to determine if a selected cell 300' on a column line 312 stores "00" or "01", the overlap in the other two states, "11" and 10" is not relevant. Here, the 50 mV voltage margin between the curves for states "00" or "01" can be used by the sense amp circuitry to determine the data stored in the selected memory cell 300' by comparing one or more reference signals with the signal on the column line 312 of the selected memory cell 300'. For example, if the signal from the column line 312 (e.g., a current signal or a voltage signal) is greater than the one or more reference signals, then the cell 300' stores the "01" state, or if the signal from the column line 312 is less than the one or more reference signals, then the cell 300' stores the "00" state.

Attention is now directed to FIG. 4C, where graphs 460 and 450 are similar to those of FIG. 4B with the exception of the voltage margin is approximately 40 mV and is the margin between states "11" and "10". Here, application of the bias voltage by the bias element 340 is operative to shift the voltage curves for the "11" and "10" and remove overlap between those states and creating a voltage margin of approximately 40 mV within the time window for sensing the page data. During a sense operation to determine if a selected cell 300' on a column line 312 stores "11" or "10", the overlap in the other two states, "00" and 01" is not relevant. Here, the 40 mV voltage margin between the curves for states "11" or "10" can be used by the sense amp circuitry to determine the data stored in the selected memory cell 300' by comparing one or more reference signals with the signal on the column line 312 of the selected memory cell 300'. For example, if the signal from the column line 312 (e.g., a current signal or a voltage signal) is greater than the one or more reference signals, then the cell 300' stores the "11" state, or if the signal from the column line 312 is less than the one or more reference signals, then the cell 300' stores the "10" state.

In FIGS. 4B and 4C, the one or more reference signals can be generated by one or more reference cells positioned in a reference column line as was described above. Hardware, software, or an algorithm can be used to control page data operations to the array 301 such that for a selected row 310', specific columns 312 (e.g., even numbered columns 312) on the selected row 310' are preselected to store only erased data (e.g., states "11" or "10") and other specific columns 312 (e.g., odd numbered columns 312) on the selected row 310' are preselected to store only programmed data (e.g., states "00" or "01"), for example. The sense amp circuitry electrically coupled with each column 312 could be configured to sense the states preselected for their respective column lines 312. That is, some sense amps are configured for sensing erased data and others are configured for sensing programmed data.

MLS can occur in two passes or cycles wherein a first cycle is operative to sense states "00" or "01" and a second cycle is operative to sense states "11" or "10". If the first cycle senses a "00" or a "01", then the second cycle can be aborted. The states sensed in the first and second cycles can be the reverse of that described above, that is, first cycle senses states "11" or "10" and the second cycle senses "00" or a "01".

Figure 5A:
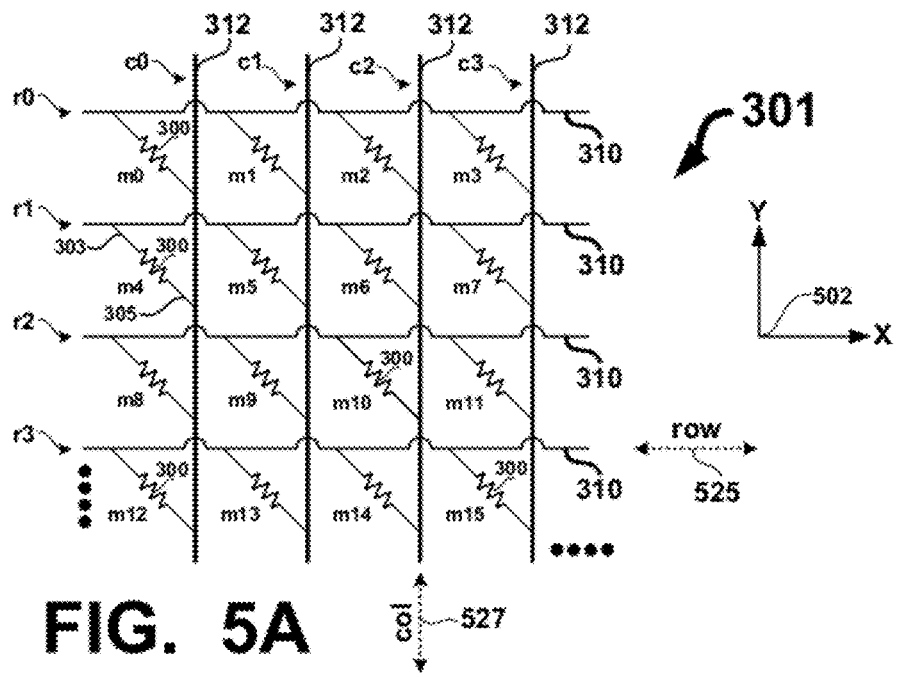
FIG. 5A depicts a schematic of at least a portion of a non-volatile two-terminal cross-point memory array.

Turning now to FIG. 5A, a portion of the array 301 includes sixteen of the memory cells 300 denoted as m0-m15. The row lines 310 are aligned 525 with an X-axis and the column lines 312 are aligned 527 with a Y-axis of coordinate system 502. The array 301 can include more or fewer memory cells 300 and can extend in the row direction 525, the column direction 527, or both.

Figure 5B:
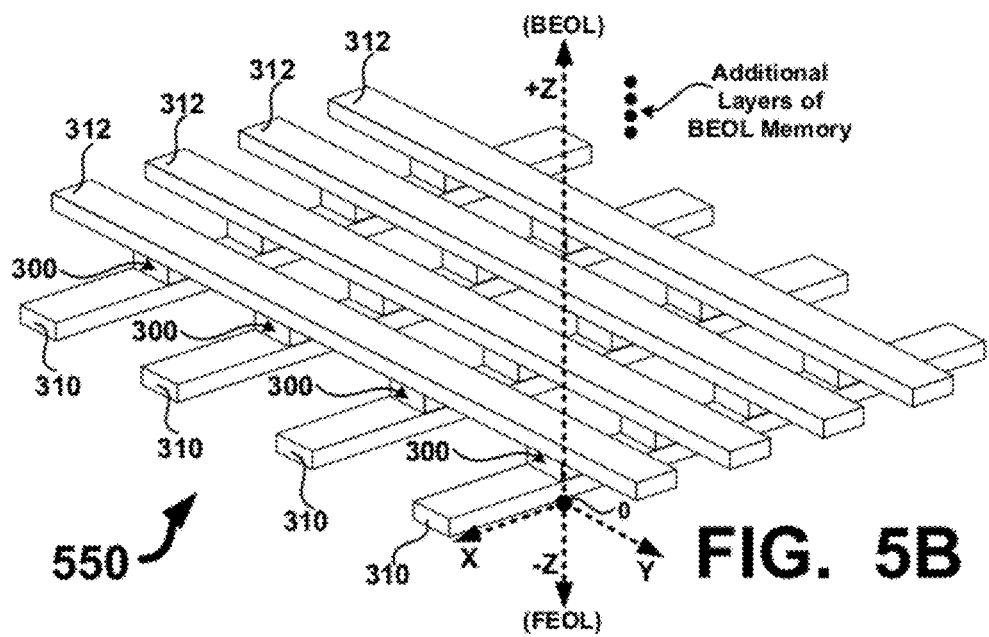
FIG. 5B depicts a perspective view of at least a portion of a BEOL non-volatile two-terminal cross-point memory array.

In FIG. 5B, a profile view of a BEOL memory array 550 depicts one layer of cross-point memory that is fabricate BEOL along a +Z axis with each memory cell 300 positioned at a cross-point between one of the electrically conductive row lines 310 and one of the electrically conductive column lines 312. Additional layers of cross-point memory (not shown) can be vertically positioned over the layer depicted in FIG. 5B. FEOL circuitry for accessing the array 550 for data operations, such as circuitry for MLS read operations, is positioned below the array 550 along a −Z axis.

Figure 5C:
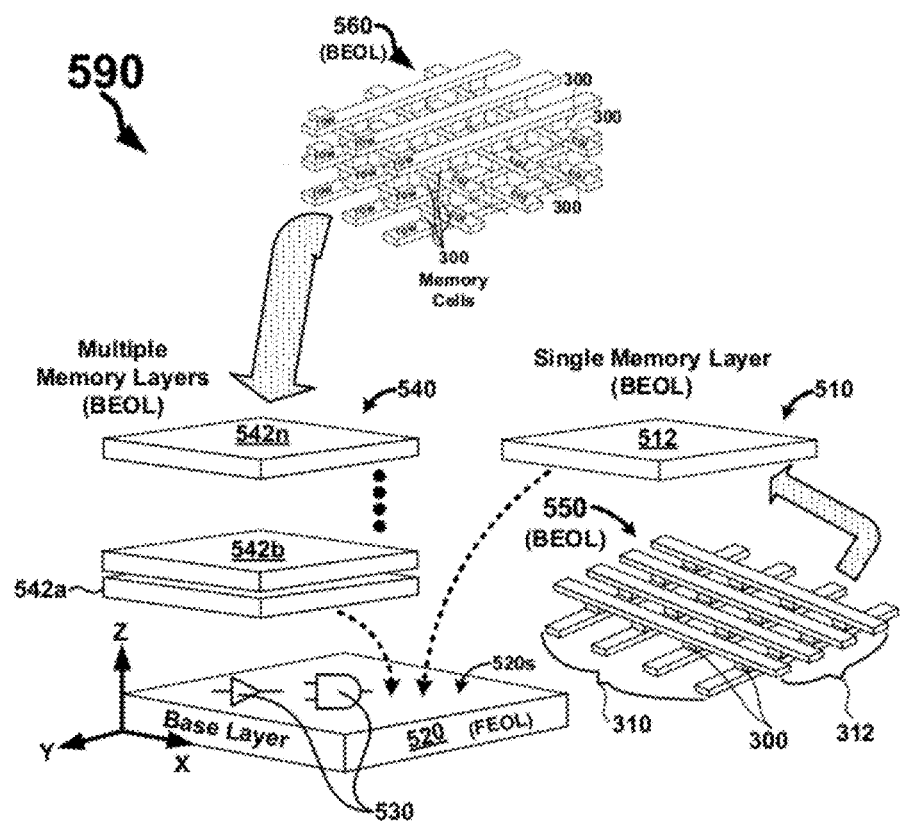
FIG. 5C depicts BEOL memory arrays fabricated over a FEOL base layer including circuitry for data operations on the BEOL arrays.

Reference is now made to FIG. 5C where an integrated circuit 590 can include a single layer 512 of BEOL memory that includes a single array 550 that is fabricated directly on top of an upper surface 520s of a FEOL base layer 520 (e.g., a silicon—Si substrate) that includes circuitry 530 (e.g., CMOS circuitry) for performing data operations on the array 550. Alternatively, the integrated circuitry 590 can include multiple BEOL memory layers 542a-542n that include a vertically stacked memory array 560 that is fabricated directly on top of the upper surface 520s of the FEOL base layer 520. The vertically stacked memory array 560 can include memory cells 300 in a layer that share conductive array lines with memory cells 300 positioned in adjacent layers above and/or below the layer as depicted or the array 560 can have memory cells 300 that do not share conductive array lines with memory cells 300 in adjacent layers (not shown).

Figure 5D:
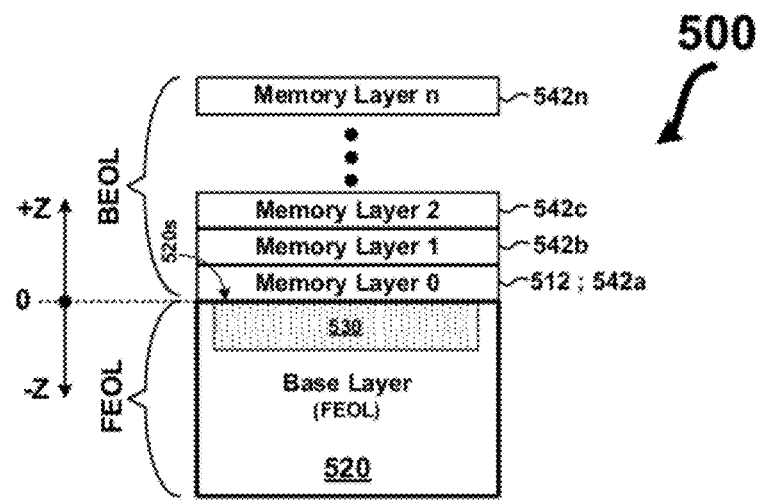
FIG. 5D depicts a cross-sectional view of a die including BEOL memory layer(s) on top of a FEOL base layer.

Moving now to FIG. 5D, an integrated circuit 500 is depicted in cross-sectional view and shows along the −Z axis the FEOL base layer 520 including circuitry 530 fabricated on the base layer 520. The integrated circuit 500 includes along the +Z axis, either a single layer of BEOL memory 512 fabricated in contact with and directly above the upper surface 520s of the base layer 520 and in electrical communication with the circuitry 530, or multiple layers of BEOL memory 542a-542n that are also fabricated in contact with and directly above the upper surface 520s of the base layer 520 and in electrical communication with the circuitry 530. The single layer 512 or the multiple layers 542a-542n are not fabricated separately and then physically and electrically coupled with the base layer 520, rather, they are grown directly on top of the base layer 520 using fabrications processes that are well understood in the microelectronics art. For example, microelectronics processes that are similar or identical to those used for fabricating CMOS devices can be used to fabricate the BEOL memory directly on top of the FEOL circuitry.

Figure 6:
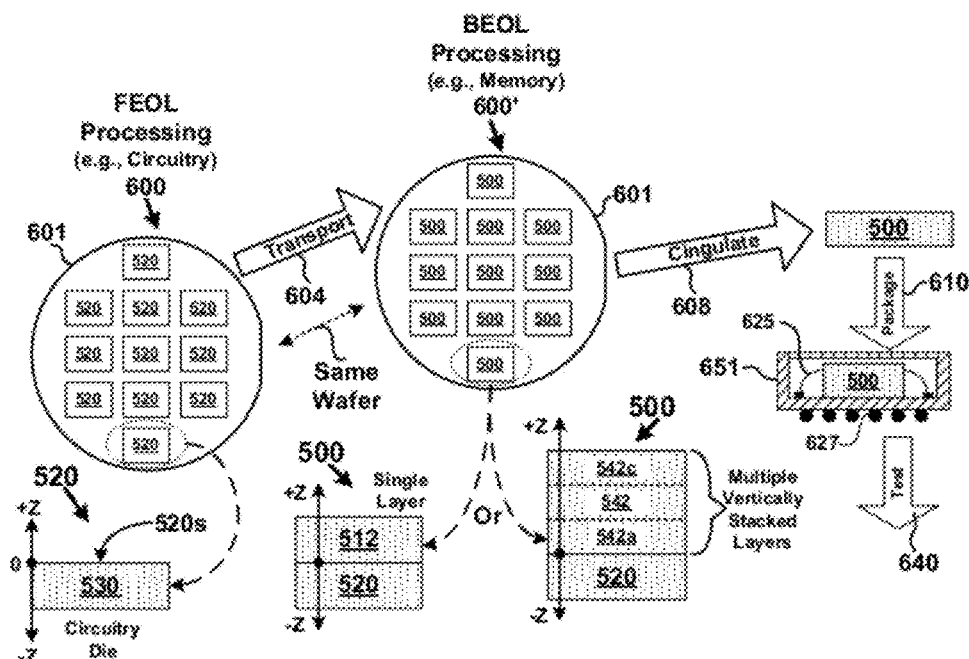
FIG. 6 depicts FEOL and BEOL processing on the same wafer to fabricate the die depicted in FIG. 5D.

Referring now to FIG. 6, a wafer (e.g., a silicon—Si wafer) is depicted during two phases of fabrication (e.g., a silicon—Si wafer). During a FEOL phase, the wafer is denoted as 600 and during a subsequent BEOL phase the same wafer is denoted as 600'. During FEOL processing the wafer 600 includes a plurality of die 520 (e.g., base layer 520) that includes the circuitry 530 of FIG. 5D fabricated on the die 520. The die 520 is depicted in cross-sectional view below wafer 600. After FEOL processing is completed, the wafer 600 undergoes BEOL processing and is denoted as 600'. Optionally, the wafer 600 can be physically transported 604 to a different processing facility for the BEOL processing. The wafer 600' undergoes BEOL processing to fabricate one or more layers of memory (512, or 542a-542c) directly on top of the upper surface 520s of the die 520 along the +Z axis as depicted in cross-sectional view below wafer 600' where integrated circuit 500 includes a single layer or multiple vertically stacked layers of BEOL memory.

After BEOL processing is completed, the integrated circuit 500 (e.g., a unitary die including FEOL circuitry and BEOL memory) can be cingulated 608 from the wafer 600' and packaged 610 in a suitable IC package 651 using wire bonding 625 to electrically communicate signals with pins 627, for example. The IC 500 can be tested for good working die prior to being cingulated 608 and/or can be tested 640 after packaging 610.

The foregoing examples have been described in some detail for purposes of clarity of understanding, but are not limited to the details provided. There are many alternative ways and techniques for implementation. The disclosed examples are illustrative and not restrictive.

What is claimed is:

1. A device, comprising:
    an integrated circuit die including a front-end-of-the-line (FEOL) portion and a back-end-of-the-line (BEOL) portion, the BEOL portion is integrally fabricated directly above and in contact with the FEOL portion, the FEOL portion comprises a silicon substrate including active circuitry;
    a plurality of first and second conductive array lines configured in a two-terminal cross-point array that is disposed in the BEOL portion, the plurality of first and second conductive array lines are electrically coupled with at least a portion of the active circuitry;
    a read voltage generator included in the active circuitry and configured to apply a read voltage to a selected one of the plurality of first conductive array lines;
    a bias element included in the active circuitry and configured to generate a bias signal that is applied to a remainder of the plurality of first conductive array lines;
    a switch included in the active circuitry and configured to apply a pre-charge voltage to the plurality of second conductive array lines, to disconnect the pre-charge voltage from the plurality of second conductive array lines, and to connect a floating voltage potential to the plurality of second conductive array lines after disconnecting the pre-charge voltage;
    sense amp circuitry included in the active circuitry and configured to sense a current flowing through each of the plurality of second conductive array lines;
    compare circuitry included in the active circuitry and configured to compare the current flowing through each of the plurality of second conductive array lines with at least one reference signal; and
    read data circuitry included in the active circuitry and configured to generate read data for each of the plurality of second conductive array lines based on the comparing.

2. The device of claim 1 and further comprising:
    a reference array line positioned in the BEOL portion and including a plurality of reference memory cells, each reference memory cell including a first terminal electrically coupled with only one of the plurality of first conductive array lines and a second terminal electrically coupled with the reference array line,
    wherein the reference array line is electrically coupled with the compare circuitry.

3. The device of claim 1 and further comprising:
    a plurality of two-terminal memory cells disposed in the two-terminal cross-point array, each memory cell including a first terminal electrically coupled with only one of the plurality of first conductive array lines and a second terminal electrically coupled with only one of the plurality of second conductive array lines, each memory cell is electrically in series with its first and second conductive array lines, and wherein the active circuitry is configured to perform data operations on a selected one or more of the plurality of two-terminal memory cells.

4. The device of claim 3, wherein memory cells having their first terminal electrically coupled with the selected one of the plurality of first conductive array lines are selected memory cells and the read data is indicative of non-volatile data stored in the selected memory cells.

5. The device of claim 3, wherein each memory cell stores non-volatile data as a plurality of conductivity profiles that can be non-destructively determined by applying the read voltage and can be reversibly switched by applying a write voltage across the first and second terminals of the memory cell.

6. The device of claim 5, wherein each memory cell stores more than one-bit of data that is retained in an absence of electrical power.

7. The device of claim 3, wherein each memory cell consists only of a two-terminal memory element that is directly electrically in series with the first and second conductive array lines of its respective memory cell.

8. The device of claim 1, wherein the pre-charge voltage is 0V.

9. The device of claim 1, wherein the sense amp circuitry senses the current flowing through each of the plurality of second conductive array lines within a predetermined time window.

10. The device of claim 1, wherein the read data comprises a page of data.

11. The device of claim 1, wherein the read data comprises a plurality of pages of data.

12. The device of claim 1, wherein the bias signal comprises a signal selected from the group consisting of a bias voltage and a bias current.

13. A device, comprising:
- an integrated circuit die including a front-end-of-the-line (FEOL) portion and a back-end-of-the-line (BEOL) portion, the BEOL portion is integrally fabricated directly above and in contact with the FEOL portion, the FEOL portion comprises a silicon substrate including active circuitry;
- a plurality of row and column array lines configured in a two-terminal cross-point array that is disposed in the BEOL portion, the plurality of row and column array lines are electrically coupled with at least a portion of the active circuitry;
- a read voltage generator included in the active circuitry and configured to apply a read voltage to a selected one of the plurality of row array lines;
- a bias element included in the active circuitry and configured to generate a bias signal that is applied to a remainder of the plurality of row array lines;
- a switch included in the active circuitry and configured to apply a pre-charge voltage to the plurality of column array lines, to disconnect the pre-charge voltage from the plurality of column array lines, and to connect a floating voltage potential to the plurality of column array lines after disconnecting the pre-charge voltage,
- wherein the plurality of column array lines comprises at least one page of data, wherein a non-volatile two-terminal multi-level cell (MLC) having a first terminal electrically coupled with only one of the plurality of row array lines and a second terminal electrically coupled with only one of the plurality of column array lines is positioned at a cross-point of its respective row and column array line;
- multi-level sense amp (MLS) circuitry included in the active circuitry and configured to sense a current flowing through each of the plurality of column array lines;
- compare circuitry included in the active circuitry and configured to compare the current flowing through each of the plurality of column array lines with at least one reference signal; and
- read data circuitry included in the active circuitry and configured to generate read data for each of the plurality of column array lines based on the comparing, the read data indicative of at least two-bits of non-volatile data stored in the MLC having its first terminal electrically coupled with the only one of the plurality of row array lines.

14. The device of claim 13 and further comprising:
- a reference array line positioned in the BEOL portion and including a plurality of reference memory cells, each reference memory cell including a first terminal electrically coupled with only one of the plurality of row array lines and a second terminal electrically coupled with the reference array line, and
- wherein the reference array line is electrically coupled with active circuitry for generating the at least one reference signal.

15. The device of claim 13 and further comprising:
- a plurality of the MLC's, wherein the active circuitry is electrically coupled with the plurality of row and column array lines and is operative to perform data operations on one or more selected MLC's.

16. The device of claim 13, wherein the MLC consists only of a two-terminal memory element that is directly electrically in series with the row and column array lines of its respective MLC.

17. The device of claim 13, wherein the two-bits of data are stored as a plurality of conductivity profiles that can be non-destructively determined by the applying the read voltage and the data is retained in an absence of electrical power.

18. A device, comprising:
- an integrated circuit die including a front-end-of-the-line portion (FEOL) and a back-end-of-the-line portion (BEOL), the BEOL portion is integrally fabricated directly above and in contact with the FEOL portion, the FEOL portion comprises a silicon substrate including active circuitry;
- a two-terminal cross-point memory array included in the BEOL portion and having a plurality of row array lines, a plurality of column array lines, and a plurality of two-terminal non-volatile multi-level cells (MLC's), each MLC positioned at a cross-point of one of the row array lines with one of the column array lines, and each MLC including a first terminal electrically coupled with its respective row array line and a second terminal electrically coupled with its respective column array line;
- a read voltage generator included in the active circuitry and configured to apply a read voltage to a selected one of the plurality of row array lines;
- a bias element included in the active circuitry and configured to generate a bias signal that is applied to a remainder of the plurality of row array lines;
- a switch included in the active circuitry and configured to apply a pre-charge voltage to at least one page of the plurality of column array lines, to disconnect the pre-charge voltage from the at least one page of the plurality of column array lines, and to connect a floating voltage potential to the at least one page of the plurality of column array lines after disconnecting the pre-charge voltage;
- multi-level sense amp (MLS) circuitry included in the active circuitry and configured to sense a current flowing through each of the plurality of column array lines in the at least one page;
- compare circuitry included in the active circuitry and configured to compare the current flowing through each of the plurality of column array lines in the at least one page with at least one reference signal; and
- read data circuitry included in the active circuitry and configured to generate read data for each of the plurality of column array lines in the at least one page based on the comparing, the read data indicative of at least two-bits of non-volatile data stored in the MLC's in the at least one page.

19. The device of claim 18, wherein at least a portion of the active circuitry is electrically coupled with the plurality of row and column array lines.

20. The device of claim 18, wherein each MLC stores at least two-bits of data as a plurality of conductivity profiles that can be non-destructively determined by applying the read voltage and the data is retained in an absence of electrical power.

* * * * *